(12) United States Patent
Bhatia et al.

(10) Patent No.: US 11,367,488 B2
(45) Date of Patent: Jun. 21, 2022

(54) MEMORY SYSTEM AND METHOD FOR READ OPERATION BASED ON GROUPING OF WORD LINES

(71) Applicant: SK hynix Inc., Icheon-si (KR)

(72) Inventors: Aman Bhatia, San Jose, CA (US); Chenrong Xiong, San Jose, CA (US); Fan Zhang, Fremont, CA (US); Naveen Kumar, San Jose, CA (US); Xuanxuan Lu, San Jose, CA (US); Yu Cai, San Jose, CA (US)

(73) Assignee: SK hynix Inc., Gyeonggi-do (KR)

( * ) Notice: Subject to any disclaimer, the term of this patent is extended or adjusted under 35 U.S.C. 154(b) by 207 days.

(21) Appl. No.: 16/711,003

(22) Filed: Dec. 11, 2019

(65) Prior Publication Data

US 2020/0185040 A1    Jun. 11, 2020

Related U.S. Application Data

(60) Provisional application No. 62/777,840, filed on Dec. 11, 2018.

(51) Int. Cl.
| | |
|---|---|
| *G11C 7/00* | (2006.01) |
| *G11C 16/26* | (2006.01) |
| *G11C 16/04* | (2006.01) |
| *G11C 16/30* | (2006.01) |
| *G06F 12/10* | (2016.01) |
| *G11C 16/08* | (2006.01) |
| *G11C 11/56* | (2006.01) |

(52) U.S. Cl.
CPC ............. *G11C 16/26* (2013.01); *G06F 12/10* (2013.01); *G11C 16/0483* (2013.01); *G11C 16/08* (2013.01); *G11C 16/30* (2013.01); *G06F 2212/2022* (2013.01); *G11C 11/5621* (2013.01)

(58) Field of Classification Search
CPC ....... G11C 7/1051; G11C 7/22; G11C 7/1072; G11C 7/1006; G11C 7/1066
USPC ........................................ 365/189.15, 189.14
See application file for complete search history.

(56) References Cited

U.S. PATENT DOCUMENTS

| | | | |
|---|---|---|---|
| 9,575,833 B2 * | 2/2017 | Jeon | ..................... G06F 11/1068 |
| 9,697,075 B2 | 7/2017 | Tate et al. | |
| 10,014,059 B2 | 7/2018 | Atsumi | |
| 10,403,372 B2 | 9/2019 | Bhatia et al. | |

(Continued)

FOREIGN PATENT DOCUMENTS

KR    10-2016-0150507 A    12/2016

OTHER PUBLICATIONS

Thompson, W R., On the likelihood that one unknown probability exceeds another in view of the evidence of two samples, Biometrika, 1933, pp. 285-294, vol. 25 No. 3/4, Oxford University Press.

(Continued)

*Primary Examiner* — Son T Dinh
(74) *Attorney, Agent, or Firm* — IP & T Group LLP

(57) ABSTRACT

A memory system includes a memory device and a controller. The controller determines a target word line group to which a target word line corresponding to a read command belongs. The controller identifies a reference voltage corresponding to the target word line group. The controller controls the memory device to perform a read operation on a target page coupled to the target word line, using the reference voltage.

17 Claims, 14 Drawing Sheets

(56) References Cited

U.S. PATENT DOCUMENTS

| | | | |
|---|---|---|---|
| 10,559,363 B2* | 2/2020 | Jung | G11C 16/3495 |
| 2014/0269085 A1* | 9/2014 | Lasser | G11C 29/028 |
| | | | 365/185.18 |
| 2017/0125111 A1 | 5/2017 | Sankaranarayanan et al. | |
| 2017/0162259 A1 | 6/2017 | Kim | |
| 2017/0206979 A1 | 7/2017 | Cohen et al. | |
| 2017/0263331 A1 | 9/2017 | Shi et al. | |
| 2018/0061504 A1 | 3/2018 | Kim et al. | |
| 2019/0035485 A1 | 1/2019 | Tate et al. | |
| 2020/0013471 A1 | 1/2020 | Cohen et al. | |

OTHER PUBLICATIONS

Ian C., Proportionate A/B testing, 2011. http://blog.locut.US/2011/09/22/proportionate-ab-testing/.

* cited by examiner

FIG. 5B
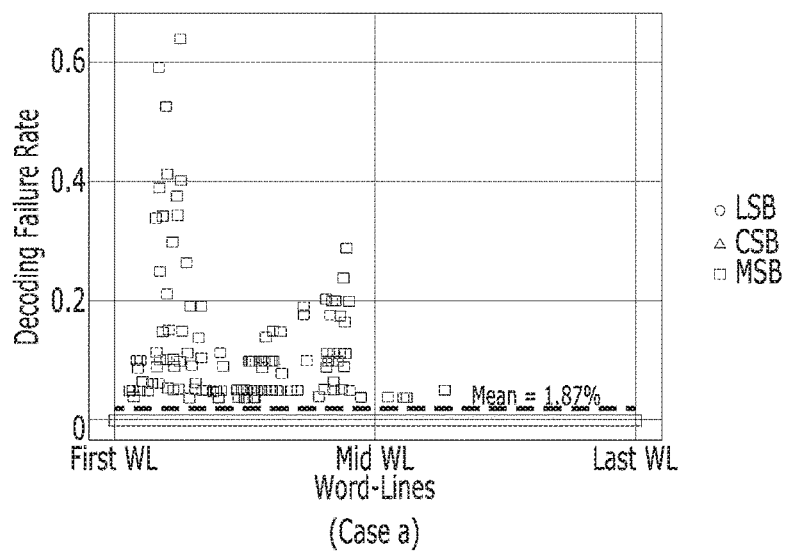
(Case a)
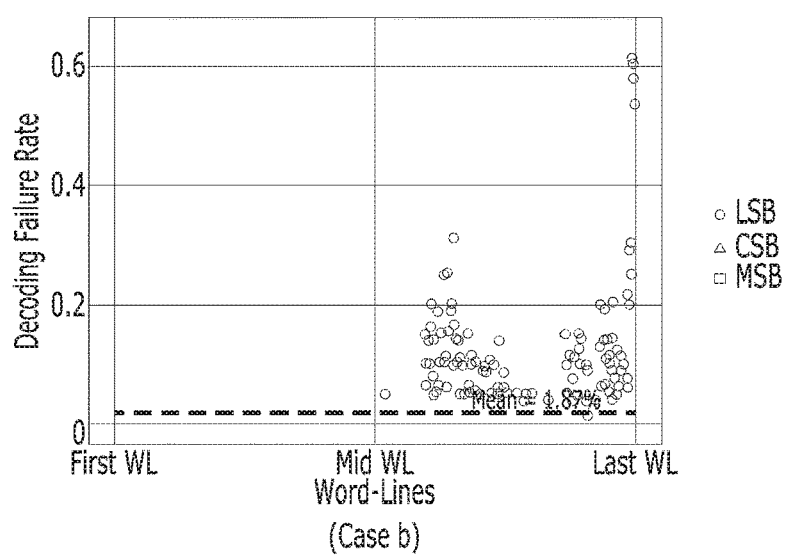
(Case b)
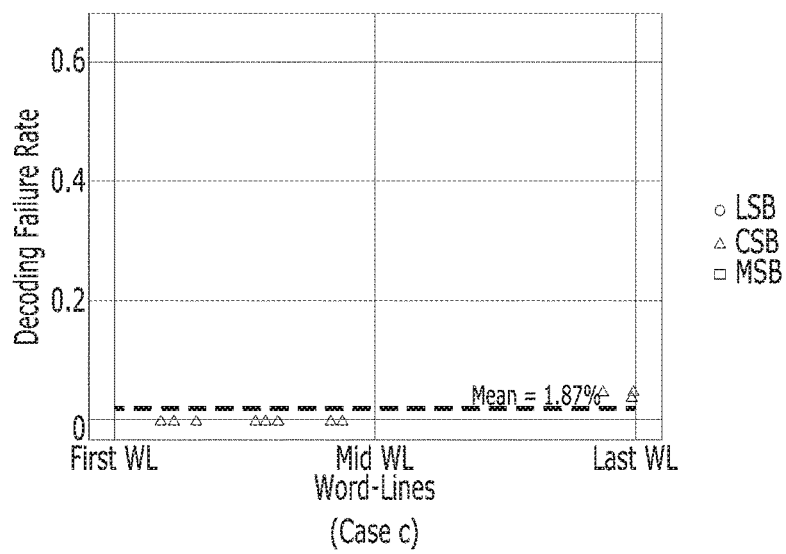
(Case c)

FIG. 8

| WL GROUP | REFERENCE VOLTAGE |
|---|---|
| GROUP0 | VREF0 |
| GROUP1 | VREF1 |
| GROUP2 | VREF2 |
| ⋮ | ⋮ |
| GROUP(k-1) | VREF(k-1) |

MEMORY SYSTEM AND METHOD FOR READ OPERATION BASED ON GROUPING OF WORD LINES

CROSS-REFERENCE TO RELATED APPLICATION

This application claims the benefit of U.S. Provisional Application No. 62/777,840, filed on Dec. 11, 2018, the entire contents of which are incorporated herein by reference.

BACKGROUND

1. Field

Embodiments of the present disclosure relate to a scheme for performing a read operation for a memory system.

2. Description of the Related Art

The computer environment paradigm has shifted to ubiquitous computing systems that can be used anytime and anywhere. As a result, the use of portable electronic devices such as mobile phones, digital cameras, and notebook computers has rapidly increased. These portable electronic devices generally use a memory system having memory device(s), that is, data storage device(s). The data storage device is used as a main memory device or an auxiliary memory device of the portable electronic devices.

Memory systems using memory devices provide excellent stability, durability, high information access speed, and low power consumption, since they have no moving parts. Examples of memory systems having such advantages include universal serial bus (USB) memory devices, memory cards having various interfaces such as a universal flash storage (UFS), and solid state drives (SSDs). Memory systems may use various read thresholds to perform read operations.

SUMMARY

Aspects of the present invention include a memory system and a method for performing a read operation based on word line groups.

In one aspect, a memory system includes a memory device including a plurality of pages coupled to a plurality of word lines and a controller. The controller receives a read command from a host. The controller determines a target word line group to which a target word line corresponding to the read command belongs, among a plurality of word line groups, which include respective subsets of the plurality of word lines. The controller identifies a reference voltage corresponding to the target word line group, among a plurality of reference voltages. The controller controls the memory device to perform a read operation on a target page coupled to the target word line, among the plurality of pages, using the reference voltage. The plurality of word line groups are generated based on at least one of the number of bit errors and decoding failure rates for the plurality of word lines.

In another aspect, a method for operating a memory system includes: receiving a read command from a host; determining a target word line group to which a target word line corresponding to the read command belongs, among a plurality of word line groups, which include respective subsets of a plurality of word lines to which a plurality of pages are coupled; identifying a reference voltage corresponding to the target word line group, among a plurality of reference voltages; and controlling the memory device to perform a read operation on a target page coupled to the target word line, among the plurality of pages, using the reference voltage. The plurality of word line groups are generated based on at least one of the number of bit errors and decoding failure rates for the plurality of word lines.

Additional aspects of the present invention will become apparent from the following description.

BRIEF DESCRIPTION OF THE DRAWINGS

FIGS. 5A and 5B are diagrams respectively illustrating the number of bit errors and decoding failure rates for all word lines when the same reference voltage is applied for all pages.

FIG. 8 is a diagram illustrating a read level table for mapping a plurality of word line groups into a plurality of reference voltages in accordance with an embodiment of the present invention.

DETAILED DESCRIPTION

Figure 1:
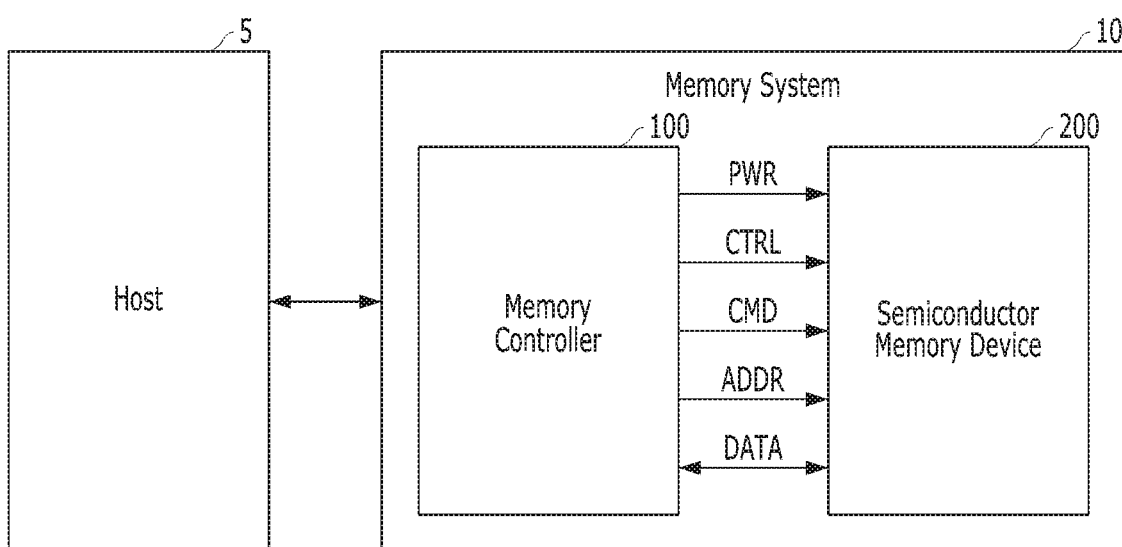
FIG. 1 is a block diagram illustrating a data processing system in accordance with an embodiment of the present invention.

Various embodiments are described below in more detail with reference to the accompanying drawings. The present invention may, however, be embodied in different forms and thus should not be construed as limited to the embodiments set forth herein. Rather, these embodiments are provided so that this disclosure is thorough and complete and fully conveys the scope of the present invention to those skilled in the art. Moreover, reference herein to "an embodiment," "another embodiment," or the like is not necessarily to only one embodiment, and different references to any such phrase are not necessarily to the same embodiment(s). Throughout the disclosure, like reference numerals refer to like parts in the figures and embodiments of the present invention.

The invention can be implemented in numerous ways, including as a process; an apparatus; a system; a computer program product embodied on a computer-readable storage medium; and/or a processor, such as a processor suitable for executing instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being suitable for performing a task may be implemented as a general component that is temporarily configured to perform the task at a given time or a specific component that is manufactured to perform the task. As used herein, the term 'processor' or the like refers to one or more devices, circuits, and/or processing cores suitable for processing data, such as computer program instructions.

A detailed description of embodiments of the invention is provided below along with accompanying figures that illustrate aspects of the invention. The invention is described in connection with such embodiments, but the invention is not limited to any embodiment. The scope of the invention is limited only by the claims. The invention encompasses numerous alternatives, modifications and equivalents within the scope of the claims. Numerous specific details are set forth in the following description in order to provide a thorough understanding of the invention. These details are provided for the purpose of example; the invention may be practiced according to the claims without some or all of these specific details. For clarity, technical material that is known in technical fields related to the invention has not been described in detail so that the invention is not unnecessarily obscured.

FIG. 1 is a block diagram illustrating a data processing system 2 in accordance with an embodiment of the present invention.

Referring FIG. 1, the data processing system 2 may include a host device 5 and a memory system 10. The memory system 10 may receive a request from the host device 5 and operate in response to the received request. For example, the memory system 10 may store data to be accessed by the host device 5.

The host device 5 may be implemented with any one of various kinds of electronic devices. In various embodiments, the host device 5 may include an electronic device such as a desktop computer, a workstation, a three-dimensional (3D) television, a smart television, a digital audio recorder, a digital audio player, a digital picture recorder, a digital picture player, and/or a digital video recorder and a digital video player. In various embodiments, the host device 5 may include a portable electronic device such as a mobile phone, a smart phone, an e-book, an MP3 player, a portable multimedia player (PMP), and/or a portable game player.

The memory system 10 may be implemented with any one of various kinds of storage devices such as a solid state drive (SSD) and a memory card. In various embodiments, the memory system 10 may be provided as one of various components in an electronic device such as a computer, an ultra-mobile personal computer (PC) (UMPC), a workstation, a net-book computer, a personal digital assistant (PDA), a portable computer, a web tablet PC, a wireless phone, a mobile phone, a smart phone, an e-book reader, a portable multimedia player (PMP), a portable game device, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage device of a data center, a device capable of receiving and transmitting information in a wireless environment, a radio-frequency identification (RFID) device, as well as one of various electronic devices of a home network, one of various electronic devices of a computer network, one of electronic devices of a telematics network, or one of various components of a computing system.

The memory system 10 may include a memory controller 100 and a semiconductor memory device 200. The memory controller 100 may control overall operations of the semiconductor memory device 200.

The semiconductor memory device 200 may perform one or more erase, program, and read operations under the control of the memory controller 100. The semiconductor memory device 200 may receive a command CMD, an address ADDR and data DATA through input/output lines. The semiconductor memory device 200 may receive power PWR through a power line and a control signal CTRL through a control line. The control signal CTRL may include a command latch enable signal, an address latch enable signal, a chip enable signal, a write enable signal, a read enable signal, as well as other operational signals depending on design and configuration of the memory system 10.

The memory controller 100 and the semiconductor memory device 200 may be integrated in a single semiconductor device such as a solid state drive (SSD). The SSD may include a storage device for storing data therein. When the semiconductor memory system 10 is used in an SSD, operation speed of a host device (e.g., host device 5 of FIG. 1) coupled to the memory system 10 may remarkably improve.

The memory controller 100 and the semiconductor memory device 200 may be integrated in a single semiconductor device such as a memory card. For example, the memory controller 100 and the semiconductor memory device 200 may be so integrated to configure a personal computer (PC) card of personal computer memory card international association (PCMCIA), a compact flash (CF) card, a smart media (SM) card, a memory stick, a multimedia card (MMC), a reduced-size multimedia card (RS-MMC), a micro-size version of MMC (MMCmicro), a secure digital (SD) card, a mini secure digital (miniSD) card, a micro secure digital (microSD) card, a secure digital high capacity (SDHC), and/or a universal flash storage (UFS).

Figure 2:
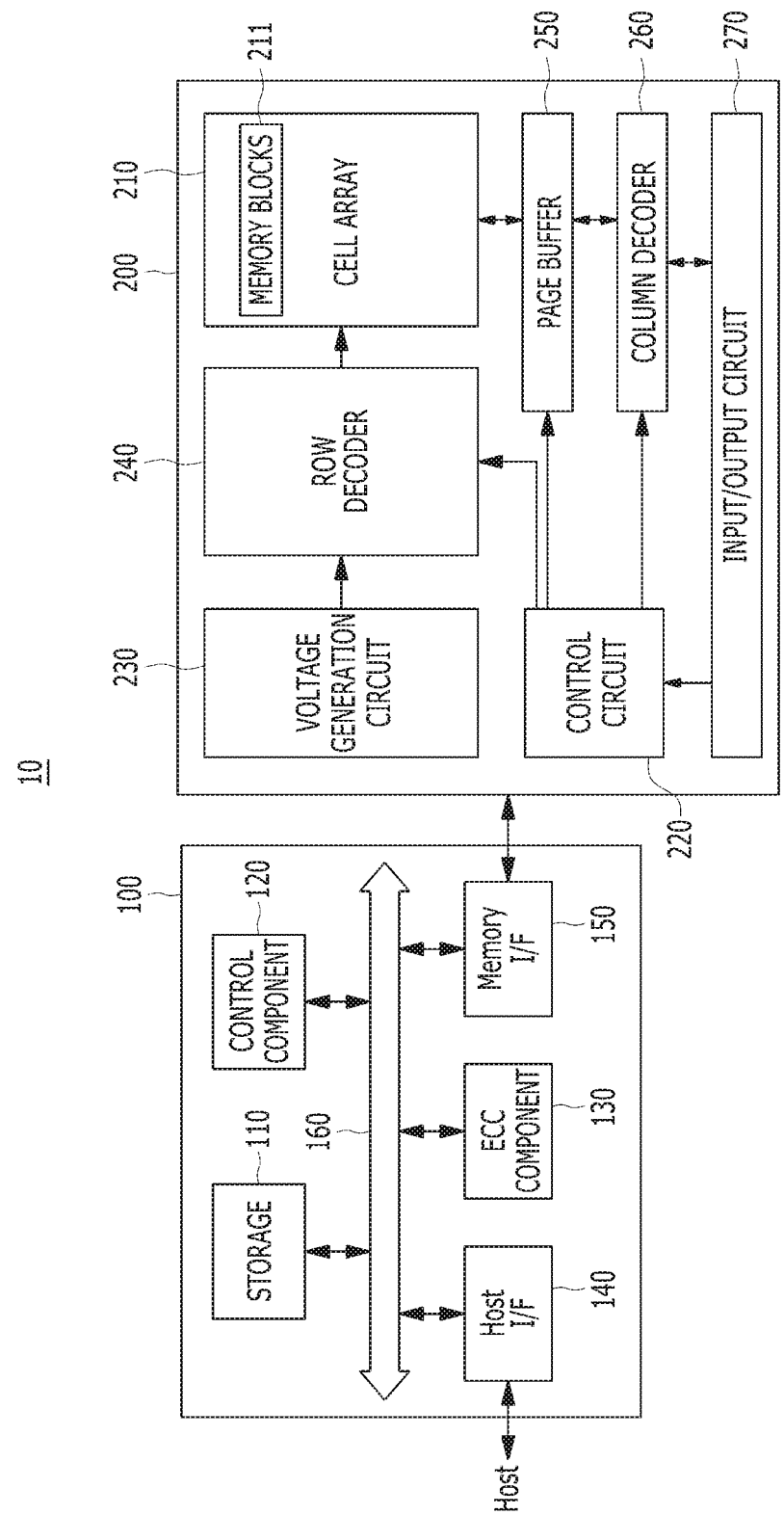
FIG. 2 is a block diagram illustrating a memory system in accordance with an embodiment of the present invention.

FIG. 2 is a block diagram illustrating a memory system in accordance with an embodiment of the present invention. For example, the memory system of FIG. 2 may depict the memory system 10 shown in FIG. 1.

Referring to FIG. 2, the memory system 10 may include a memory controller 100 and a semiconductor memory device 200. The memory system 10 may operate in response to a request from a host device (e.g., host device 5 of FIG. 1), and in particular, store data to be accessed by the host device.

The memory device 200 may store data to be accessed by the host device.

The memory device 200 may be implemented with a volatile memory device such as a dynamic random access memory (DRAM) and/or a static random access memory (SRAM) or a non-volatile memory device such as a read only memory (ROM), a mask ROM (MROM), a programmable ROM (PROM), an erasable programmable ROM (EPROM), an electrically erasable programmable ROM (EEPROM), a ferroelectric random access memory (FRAM), a phase change RAM (PRAM), a magnetoresistive RAM (MRAM), and/or a resistive RAM (RRAM).

The controller 100 may control storage of data in the memory device 200. For example, the controller 100 may control the memory device 200 in response to a request from the host device. The controller 100 may provide data read from the memory device 200 to the host device, and may store data provided from the host device into the memory device 200.

The controller 100 may include a storage 110, a control component 120, which may be implemented as a processor such as a central processing unit (CPU), an error correction code (ECC) component 130, a host interface (I/F) 140 and a memory interface (I/F) 150, which are coupled through a bus 160.

The storage 110 may serve as a working memory of the memory system 10 and the controller 100, and store data for driving the memory system 10 and the controller 100. When the controller 100 controls operations of the memory device 200, the storage 110 may store data used by the controller 100 and the memory device 200 for such operations as read, write, program and erase operations.

The storage 110 may be implemented with a volatile memory such as a static random access memory (SRAM) or a dynamic random access memory (DRAM). As described above, the storage 110 may store data used by the host device in the memory device 200 for the read and write operations. To store the data, the storage 110 may include a program memory, a data memory, a write buffer, a read buffer, a map buffer, and the like.

The control component 120 may control general operations of the memory system 10, and a write operation or a read operation for the memory device 200, in response to a write request or a read request from the host device. The control component 120 may drive firmware, which is referred to as a flash translation layer (FTL), to control general operations of the memory system 10. For example, the FTL may perform operations such as logical-to-physical (L2P) mapping, wear leveling, garbage collection, and/or bad block handling. The L2P mapping is known as logical block addressing (LBA).

The ECC component 130 may detect and correct errors in the data read from the memory device 200 during the read operation. The ECC component 130 may not correct error bits when the number of the error bits is greater than or equal to a threshold number of correctable error bits, and instead may output an error correction fail signal indicating failure in correcting the error bits.

In various embodiments, the ECC component 130 may perform an error correction operation based on a coded modulation such as a low density parity check (LDPC) code, a Bose-Chaudhuri-Hocquenghem (BCH) code, a turbo code, a turbo product code (TPC), a Reed-Solomon (RS) code, a convolution code, a recursive systematic code (RSC), a trellis-coded modulation (TCM), or a Block coded modulation (BCM). However, error correction is not limited to these techniques. As such, the ECC component 130 may include any and all circuits, systems or devices for suitable error correction operation.

The host interface 140 may communicate with the host device through one or more of various interface protocols such as a universal serial bus (USB), a multi-media card (MMC), a peripheral component interconnect express (PCI-e or PCIe), a small computer system interface (SCSI), a serial-attached SCSI (SAS), a serial advanced technology attachment (SATA), a parallel advanced technology attachment (DATA), an enhanced small disk interface (ESDI), and an integrated drive electronics (IDE).

The memory interface 150 may provide an interface between the controller 100 and the memory device 200 to allow the controller 100 to control the memory device 200 in response to a request from the host device. The memory interface 150 may generate control signals for the memory device 200 and process data under the control of the control component 120. When the memory device 200 is a flash memory such as a NAND flash memory, the memory interface 150 may generate control signals for the memory and process data under the control of the control component 120.

The memory device 200 may include a memory cell array 210, a control circuit 220, a voltage generation circuit 230, a row decoder 240, a page buffer 250, which may be in the form of an array of page buffers, a column decoder 260, and an input and output (input/output) circuit 270. The memory cell array 210 may include a plurality of memory blocks 211 which may store data. The voltage generation circuit 230, the row decoder 240, the page buffer array 250, the column decoder 260 and the input/output circuit 270 may form a peripheral circuit for the memory cell array 210. The peripheral circuit may perform a program, read, or erase operation of the memory cell array 210. The control circuit 220 may control the peripheral circuit.

The voltage generation circuit 230 may generate operation voltages of various levels. For example, in an erase operation, the voltage generation circuit 230 may generate operation voltages of various levels such as an erase voltage and a pass voltage.

The row decoder 240 may be in electrical communication with the voltage generation circuit 230, and the plurality of memory blocks 211. The row decoder 240 may select at least one memory block among the plurality of memory blocks 211 in response to a row address generated by the control circuit 220, and transmit operation voltages supplied from the voltage generation circuit 230 to the selected memory blocks.

Figure 3:
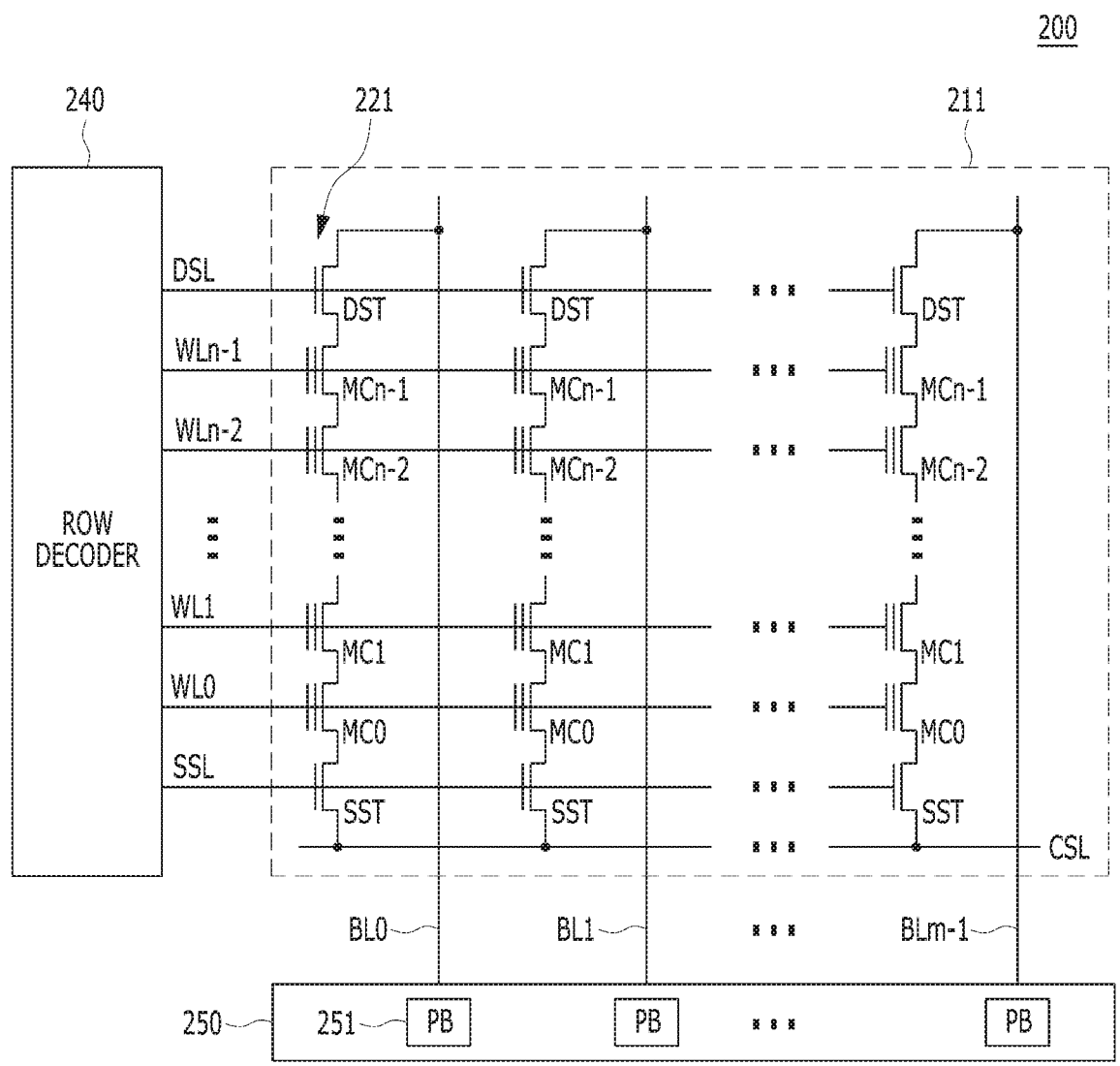
FIG. 3 is a circuit diagram illustrating a memory block of a memory device in accordance with an embodiment of the present invention.

The page buffer 250 may be coupled with the memory cell array 210 through bit lines BL (shown in FIG. 3). The page buffer 250 may precharge the bit lines BL with a positive voltage, transmit data to, and receive data from, a selected memory block in program and read operations, or temporarily store transmitted data, in response to page buffer control signal(s) generated by the control circuit 220.

The column decoder 260 may transmit data to, and receive data from, the page buffer 250 or transmit and receive data to and from the input/output circuit 270.

The input/output circuit 270 may transmit to the control circuit 220 a command and an address, received from an external device (e.g., the memory controller 100 of FIG. 1), transmit data from the external device to the column decoder 260, or output data from the column decoder 260 to the external device, through the input/output circuit 270.

The control circuit 220 may control the peripheral circuit in response to the command and the address.

FIG. 3 is a circuit diagram illustrating a memory block of a semiconductor memory device in accordance with an embodiment of the present invention. For example, the memory block of FIG. 3 may be any of the memory blocks 211 of the memory cell array 210 shown in FIG. 2.

Referring to FIG. 3, the exemplary memory block 211 may include a plurality of word lines WL0 to WLn-1, a drain select line DSL and a source select line SSL coupled to the row decoder 240. These lines may be arranged in parallel, with the plurality of word lines between the DSL and SSL.

The exemplary memory block 211 may further include a plurality of cell strings 221 respectively coupled to bit lines BL0 to BLm-1. The cell string of each column may include one or more drain selection transistors DST and one or more source selection transistors SST. In the illustrated embodiment, each cell string has one DST and one SST. In a cell string, a plurality of memory cells or memory cell transistors MC0 to MCn-1 may be serially coupled between the selection transistors DST and SST. Each of the memory cells may be formed as a multiple level cell. For example, each of the memory cells may be formed as a single level cell (SLC) storing 1 bit of data. Each of the memory cells may be formed as a multi-level cell (MLC) storing 2 bits of data. Each of the memory cells may be formed as a triple-level cell (TLC) storing 3 bits of data. Each of the memory cells may be formed as a quadruple-level cell (QLC) storing 4 bits of data.

The source of the SST in each cell string may be coupled to a common source line CSL, and the drain of each DST may be coupled to the corresponding bit line. Gates of the SSTs in the cell strings may be coupled to the SSL, and gates of the DSTs in the cell strings may be coupled to the DSL. Gates of the memory cells across the cell strings may be coupled to respective word lines. That is, the gates of memory cells MC0 are coupled to corresponding word line WL0, the gates of memory cells MC1 are coupled to corresponding word line WL1, etc. The group of memory cells coupled to a particular word line may be referred to as a physical page. Therefore, the number of physical pages in the memory block 211 may correspond to the number of word lines.

The page buffer array 250 may include a plurality of page buffers 251 that are coupled to the bit lines BL0 to BLm-1. The page buffers 251 may operate in response to page buffer control signals. For example, the page buffers 251 my temporarily store data received through the bit lines BL0 to BLm-1 or sense voltages or currents of the bit lines during a read or verify operation.

In some embodiments, the memory blocks 211 may include a NAND-type flash memory cell. However, the memory blocks 211 are not limited to such cell type, but may include NOR-type flash memory cell(s). Memory cell array 210 may be implemented as a hybrid flash memory in which two or more types of memory cells are combined, or one-NAND flash memory in which a controller is embedded inside a memory chip.

In some embodiments, the memory blocks 211 may include a NAND-type flash memory cell. However, the memory blocks 211 are not limited to such cell type, but may include NOR-type flash memory cell(s). Memory cell array 210 may be implemented as a hybrid flash memory in which two or more types of memory cells are combined, or one-NAND flash memory in which a controller is embedded inside a memory chip.

A memory device such as a flash memory (e.g., NAND flash memory) may include a plurality of memory blocks (e.g., hundreds to thousands of memory blocks). Each block typically may include a plurality of wordlines (e.g., hundreds of wordlines). Each cell coupled to each wordline may include multiple logical pages. The memory device may include a plurality of memory cells and store multiple bits per cell by modulating the cell into different states or program voltage (PV) levels through a programming operation.

Figure 4:
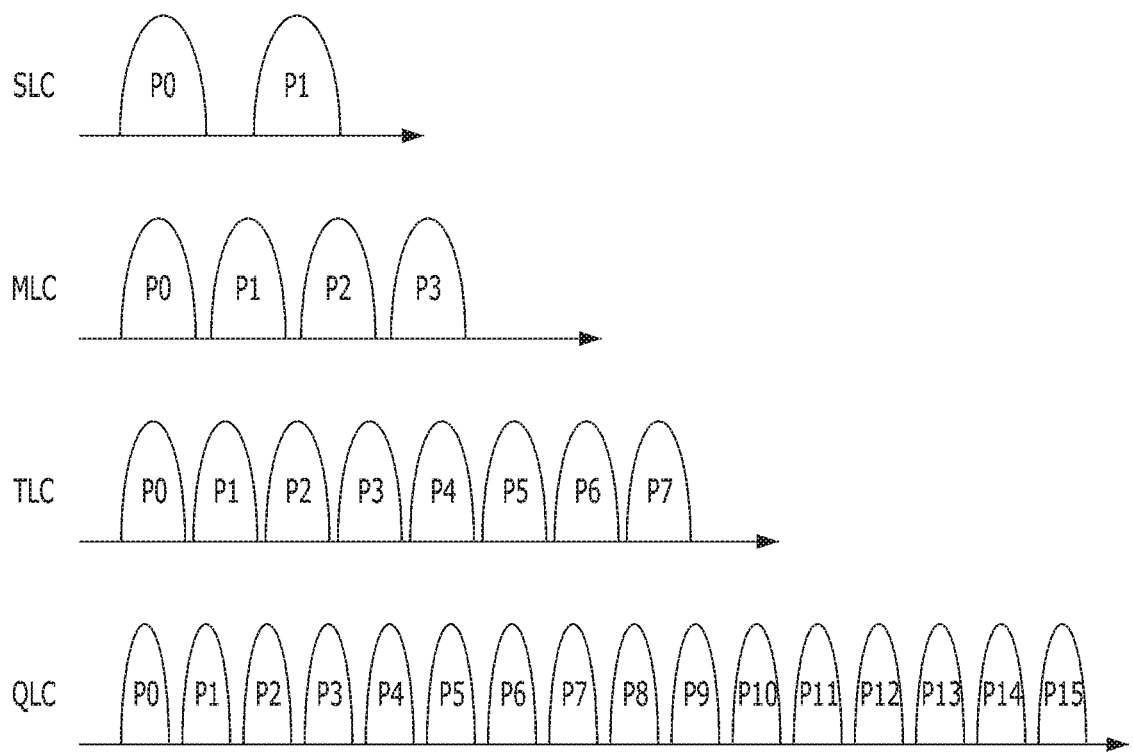
FIG. 4 is a diagram illustrating distributions of states for different types of cells of a memory device.

FIG. 4 is a diagram illustrating distributions of states or program voltage (PV) levels for different types of cells of a memory device.

Referring to FIG. 4, each of memory cells may be implemented with a specific type of cell, for example, a single level cell (SLC) storing 1 bit of data, a multi-level cell (MLC) storing 2 bits of data, a triple-level cell (TLC) storing 3 bits of data, or a quadruple-level cell (QLC) storing 4 bits of data. Usually, all memory cells in a particular memory device are of the same type, but that is not a requirement.

An SLC may include two states P0 and P1. P0 may indicate an erase state, and P1 may indicate a program state. Since the SLC can be set in one of two different states, each SLC may program or store 1 bit according to a set coding method. An MLC may include four states P0, P1, P2 and P3. Among these states, P0 may indicate an erase state, and P1 to P3 may indicate program states. Since the MLC can be set in one of four different states, each MLC may program or store two bits according to a set coding method. A TLC may include eight states P0 to P7. Among these states, P0 may indicate an erase state, and P1 to P7 may indicate program states. Since the TLC can be set in one of eight different states, each TLC may program or store three bits according to a set coding method. A QLC may include 16 states P0 to P15. Among these states, P0 may indicate an erase state, and P1 to P15 may indicate program states. Since the QLC can be set in one of sixteen different states, each QLC may program or store four bits according to a set coding method.

As such, for an n-bit multiple level cell flash memory, cells can be modulated into multiple states based on their program voltage levels. SLC, MLC, TLC and QLC memories can store one bit, two bits, three bits and four bits respectively in each cell using 2, 4, 8 and 16 possible states. In order to determine the bit stored in a cell, the cell may be read with a reference voltage which lies between the adjacent program voltage levels. Since the program voltage of a cell is noisy, i.e., fluctuates somewhat, some bits may be read erroneously. An error correction code such as BCH code or LDPC code may be required to detect and correct errors of cells. When the number of errors is large, correction is not possible and thus decoding fails. In that case, the corresponding page has to be read again using a different reference voltage. In other words, read retry operations may be performed. The read retry operations may increase the latency of read operations and reduce the overall performance of a memory system. Therefore, it is desirable that a reference voltage for a first read operation be chosen carefully to reduce a decoding failure rate. However, in a conventional memory system, the same reference voltage is applied for all pages.

Figure 5A:
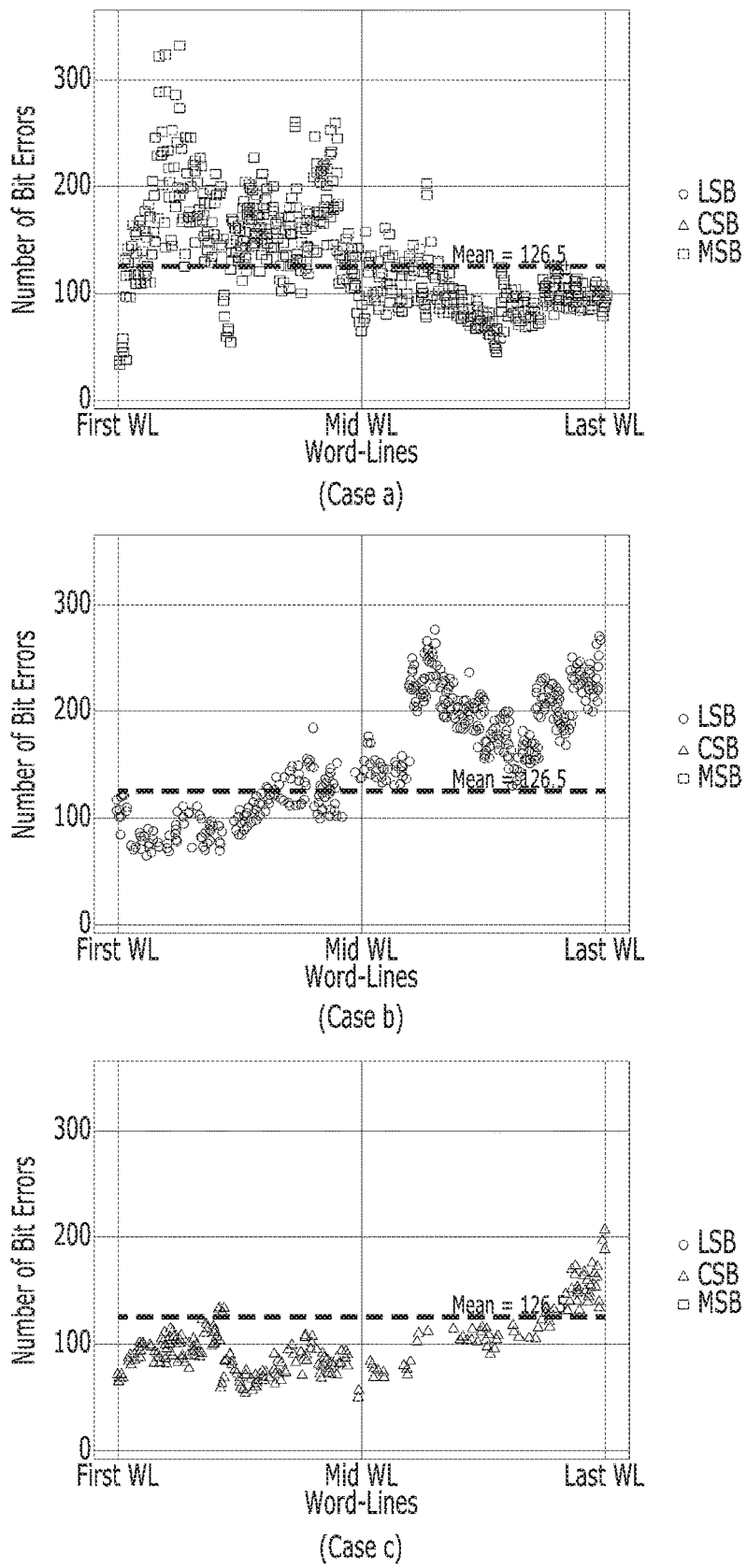

FIGS. 5A and 5B are diagrams respectively illustrating the number of bit errors and decoding failure rates for all word lines (WLs) when the same reference voltage is applied for all logical pages for TLC NAND flash memory.

In (Case a) of FIGS. 5A and 5B, it is observed that the number of bit errors and decoding failure rates of most significant bit (MSB) pages in the first half of all WLs (i.e., first WL to mid WL) are greater than those of MSB pages in the second half of the WLs (i.e., mid WL to last WL). In (Case b) of FIGS. 5A and 5B, it is observed that the number of bit errors and decoding failure rates of least significant bit (LSB) pages in the second half of the WLs are greater than those of LSB pages in the first half of the WLs. In other words, the MSB pages in the first half of the WLs and the LSB pages in the second half of the WLs are significantly worse than other pages.

Various embodiments provide a scheme in which reference voltages for the first read attempt are chosen based on the grouping of word lines (WLs) into two or more groups. The scheme may apply a different reference voltage to a target page to be read, depending on the WL group to which a word line coupled to the target page belongs. The scheme may reduce the number of incorrect bits in data read from the target page and reduce the decoding failure rate.

Figure 6:
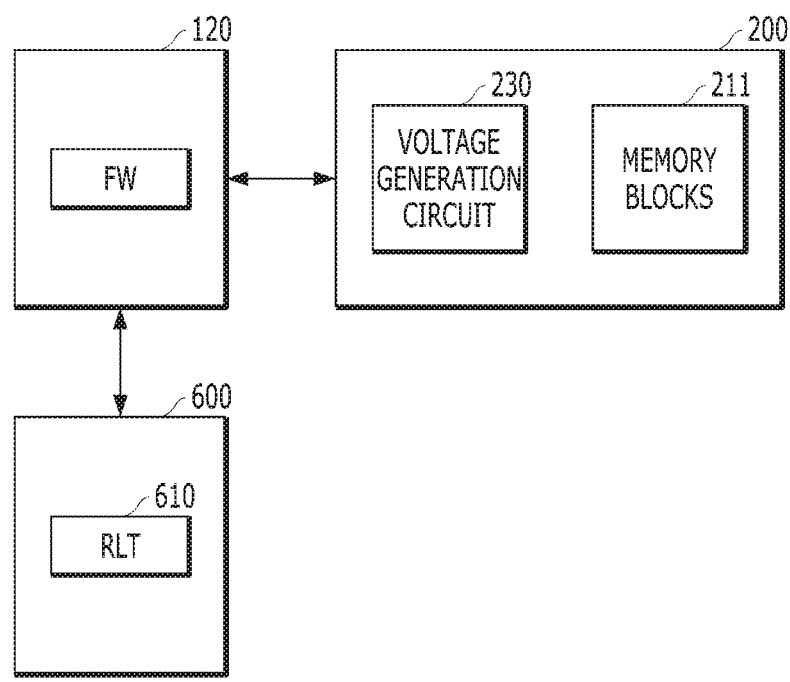
FIG. 6 is a diagram illustrating a memory system in accordance with an embodiment of the present invention.

FIG. 6 is a diagram illustrating a memory system 10 in accordance with an embodiment of the present invention.

Referring to FIG. 6, the memory system 10 may include a control component 120, a memory device 200 and a memory 600. The control component 120, the memory device 200 and the memory 600 of FIG. 5 may be implemented as the components of the memory system 10 shown in FIG. 2. The control component 120 and the memory 600 may be components of the controller 100 in FIG. 2. Alternatively, the memory 600 may be a component which is located outside and coupled to the controller 100.

Figure 7:
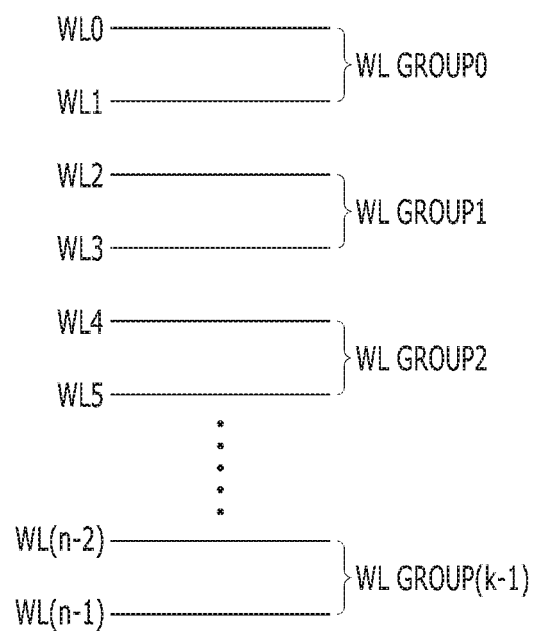
FIG. 7 is a diagram illustrating an operation of generating a plurality of word line groups in accordance with an embodiment of the present invention.
Figure 9A:
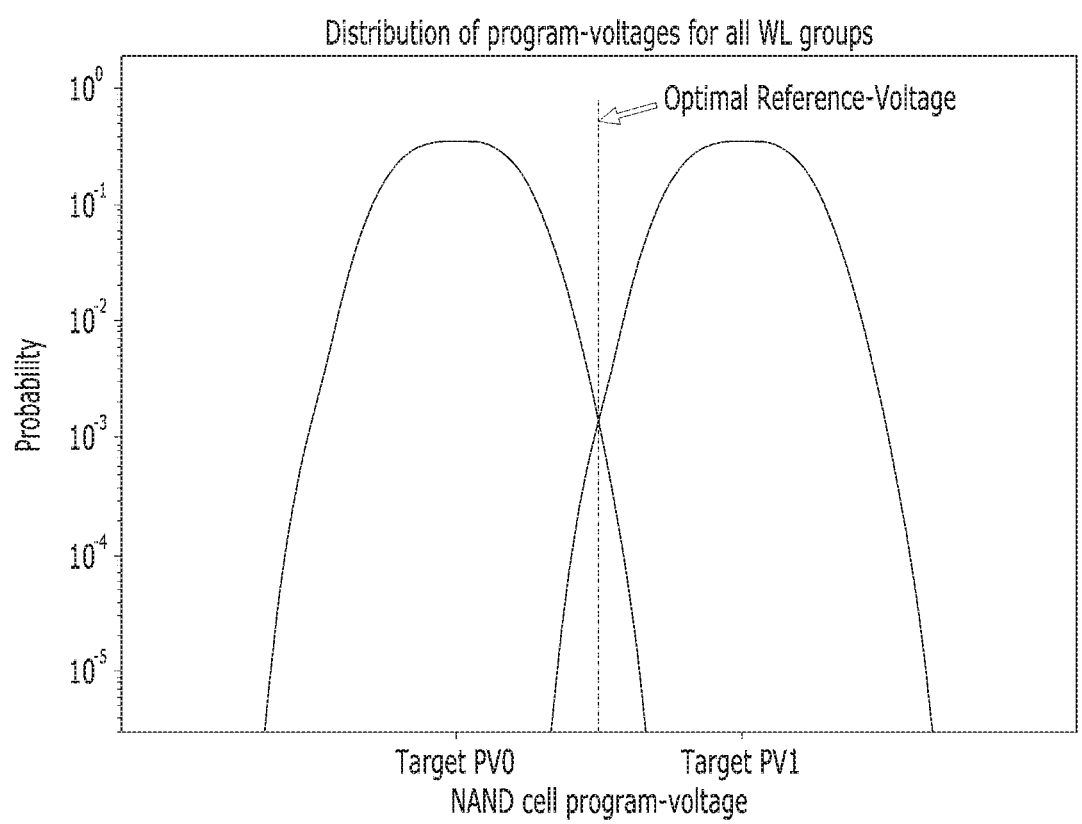
FIGS. 9A and 9B are diagrams illustrating distributions of program voltages for word line groups in accordance with an embodiment of the present invention.
Figure 9B:
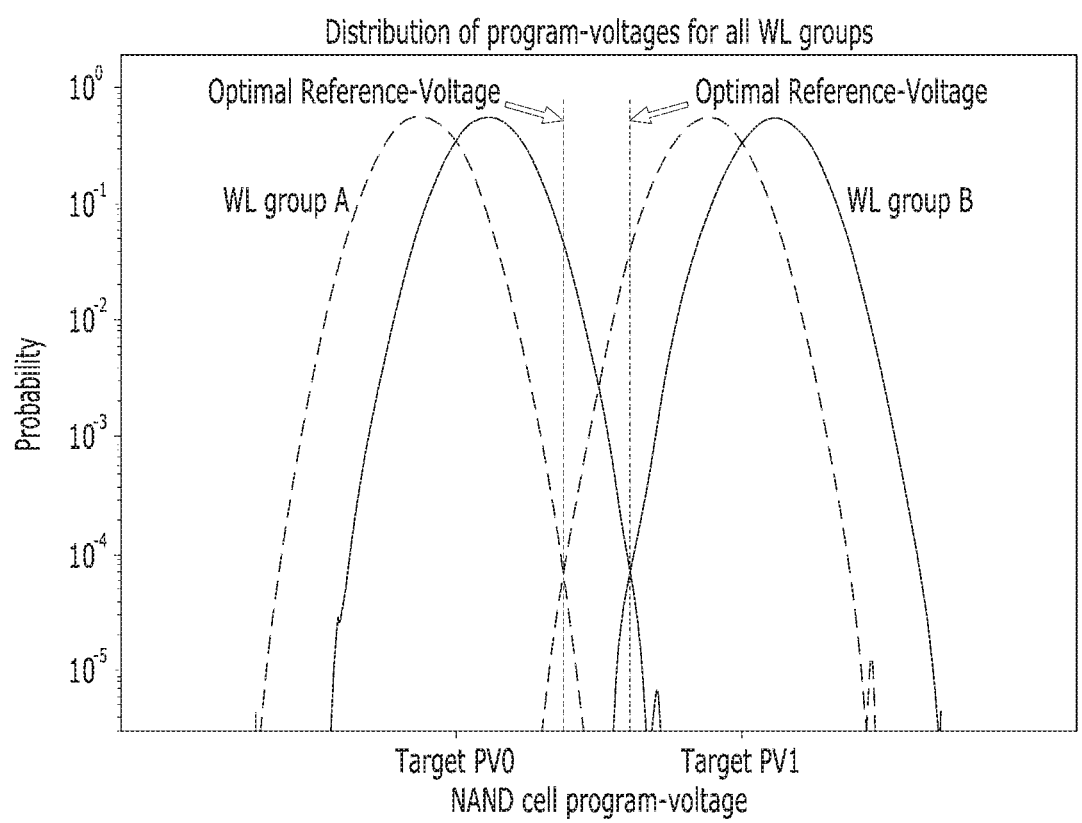

The control component 120 may include firmware (FW). The memory 600 may include a read level table (RLT) 610. The memory device 200 may include a plurality of memory blocks 211 and a voltage generation circuit 230, as shown in FIG. 2. All WLs of the memory blocks 211 may behave differently due to the physical layout of the memory device 200, for example, 3D NAND Flash memory. This results in different distributions of program-voltages for cells in different WLs. Accordingly, in some embodiments, all WLs may be grouped to two or more groups based on their physical location, as shown in FIG. 7, such that cells in the same WL group have similar distribution of program voltages, and cells in different WL groups have substantially different distributions of program voltages, as shown in FIGS. 9A and 9B. In such a case, the optimal reference voltage which minimizes the number of errors may be different for different WL groups, as shown in FIG. 8.

FIG. 7 is a diagram illustrating an operation of generating a plurality of word line groups in accordance with an embodiment of the present invention. The operation of FIG. 7 may be performed by the control component 120 of FIG. 6.

Referring to FIG. 7, the control component 120 may group a plurality of word lines (WLs) to generate a plurality of word line (WL) groups. By way of example and not limitation, n word lines WL0 to WL (n-1) may divided to generate k word line groups GROUP0 to GROUP (k-1). Word lines WL0 and WL1 belong to a first word line group GROUP0. Word lines WL2 and WL3 belong to a second word line group GROUP1, Word lines WL4 and WL5 belong to a third word line group GROUP2. Word lines WL (n-2) and WL (n-1) belong to a k-th word line group GROUP (k-1). Although FIG. 7 illustrates that a word line group includes two word lines, the number of word lines in a word line group may be greater than 2. The number of word lines in a word line group may be determined based on error characteristics such as the number of bit errors and decoding failure rates for all of the word lines in the system of interest, as shown in FIGS. 5A and 5B.

In some embodiments, the plurality of word lines may be divided into 2 word line groups including a first word line group and a second word line group. The first word line group may include a first word line and successively adjacent word lines subsequent to the first word line (e.g., the first half word lines in FIGS. 5A and 5B). The second word line group may include the remaining word lines up to a last word line (e.g., the second half word lines in FIGS. 5A and 5B). More generally, each group contains a set of word lines that have cells with similar program voltage distributions and thus to which the same optimal reference voltage may be applied. The number of word lines in a group may vary, as may the number groups, which may be any suitable number of 2 or more.

FIG. 8 is a diagram illustrating an operation of mapping a plurality of word line groups to a plurality of optimal reference voltages respectively in accordance with an embodiment of the present invention. The operation of FIG. 8 may be performed by the control component 120 of FIG. 6.

Referring to FIG. 8, the plurality of word line groups GROUP0 to GROUP (k-1) may be mapped to the plurality of optimal reference voltages VREF0 to VREF (k-1) respectively. For example, a first word line group GROUP0 may be mapped to a first optimal reference voltage VREF0, and a k-th word line group GROUP (k-1) may be mapped to a k-th optimal reference voltage VREF (k-1).

Before performing the operation of FIG. 8, the control component 120 may determine an optimal reference voltage for each word line group, which minimizes the number of errors, such as the number of bit errors and decoding failure rates. The optimal reference voltage for each word line group may be determined through an offline or online search.

FIG. 9A illustrates combined distribution of program voltages for all word line groups. FIG. 9B illustrate distributions of program voltages for two word line groups. In FIGS. 9A and 9B, x-axis represents NAND cell program voltage, and y-axis represents probability of success of the program voltages. As shown in FIG. 9A, one optimal reference voltage is identified as shown. In FIG. 9B, two different optimal reference voltages are identified, one that minimizes the number of errors in WL group A and another that minimizes the number of errors in WL group B.

Referring back to FIG. 6, the control component 120 may store the mapping relationship between the plurality of word line groups and the plurality of reference voltages in the read level table 610.

The control component 120 may receive a read command and a logical address associated with the read command from a host (e.g., the host of FIG. 1). The control component 120 may translate the logical address into a physical address, and determine a target word line group among a plurality of word line groups. The target word line group may be a word line group to which a target word line corresponding to the physical address belongs.

The control component 120 may determine a reference voltage corresponding to the target word line group, among a plurality of reference voltages. The control component 120 may control the memory device 200 to perform a read operation on a target page coupled to the target word line, among the plurality of pages. In other words, the control component 120 may provide the memory device 200 with information on the determined reference voltage and the target page. The voltage generation circuit 230 may receive the information, generate the reference voltage in response to the information. The generated reference voltage may be provided to the target page in a target memory block of the memory blocks 211. Thus, the read operation may be performed on the target page using the reference voltage.

Figure 10:
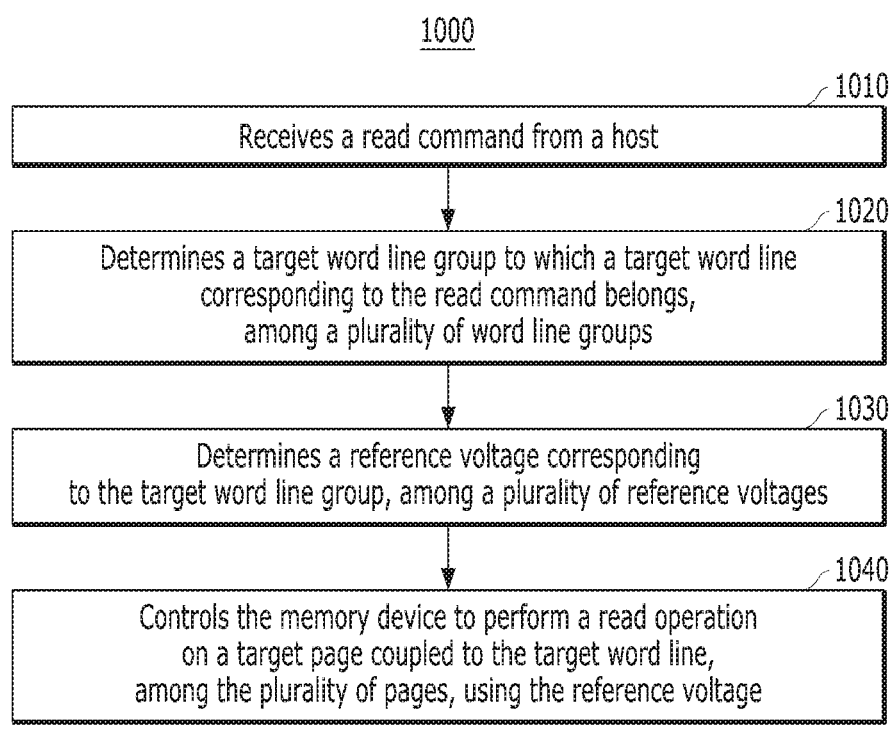
FIG. 10 is a flowchart illustrating a method for operating a memory system in accordance with an embodiment of the present invention.

FIG. 10 is a flowchart illustrating a method 1000 for operating a memory system in accordance with an embodiment of the present invention. The method 1000 may be performed by the control component 120 of FIG. 6

Referring to FIG. 10, the method 1000 may include steps 1010 to 1040. At step 1010, the control component 120 may receive a read command from a host.

At step 1020, the control component 120 may determine a target word line group to which a target word line corresponding to the read command belongs, among a plurality of word line groups. Each word line group may include a respective subset of all of the word lines to which the pages are coupled. Step 1020 may include translating a logical address corresponding to the read command into a physical address, and determining the target word line group to which the target word line corresponding to the physical address belongs.

The control component 120 may store, in the memory 600, a plurality of reference voltages for the plurality of word line groups. A respective reference voltage may correspond to a respective word line group in a one-to-one relationship. Such correspondence may be stored in the RLT 610.

At step 1030, the control component 120 may determine the reference voltage corresponding to the target word line group. The control component 120 may access the RLT 610 to identify the reference voltage corresponding to the target word line group.

At step 1040, the control component 120 may control the memory device 200 to perform a read operation on a target page coupled to the target word line, among the plurality of pages, using the reference voltage. The target page may be determined by the physical address corresponding to the logical address of the read command. In step 1040, the controller 100 may provide the memory device 200 with information on the identified reference voltage. The voltage generation circuit 230 may receive the information from the controller 100. The voltage generation circuit 230 may generate the reference voltage and provide the target word line with the reference voltage.

Figure 11A:
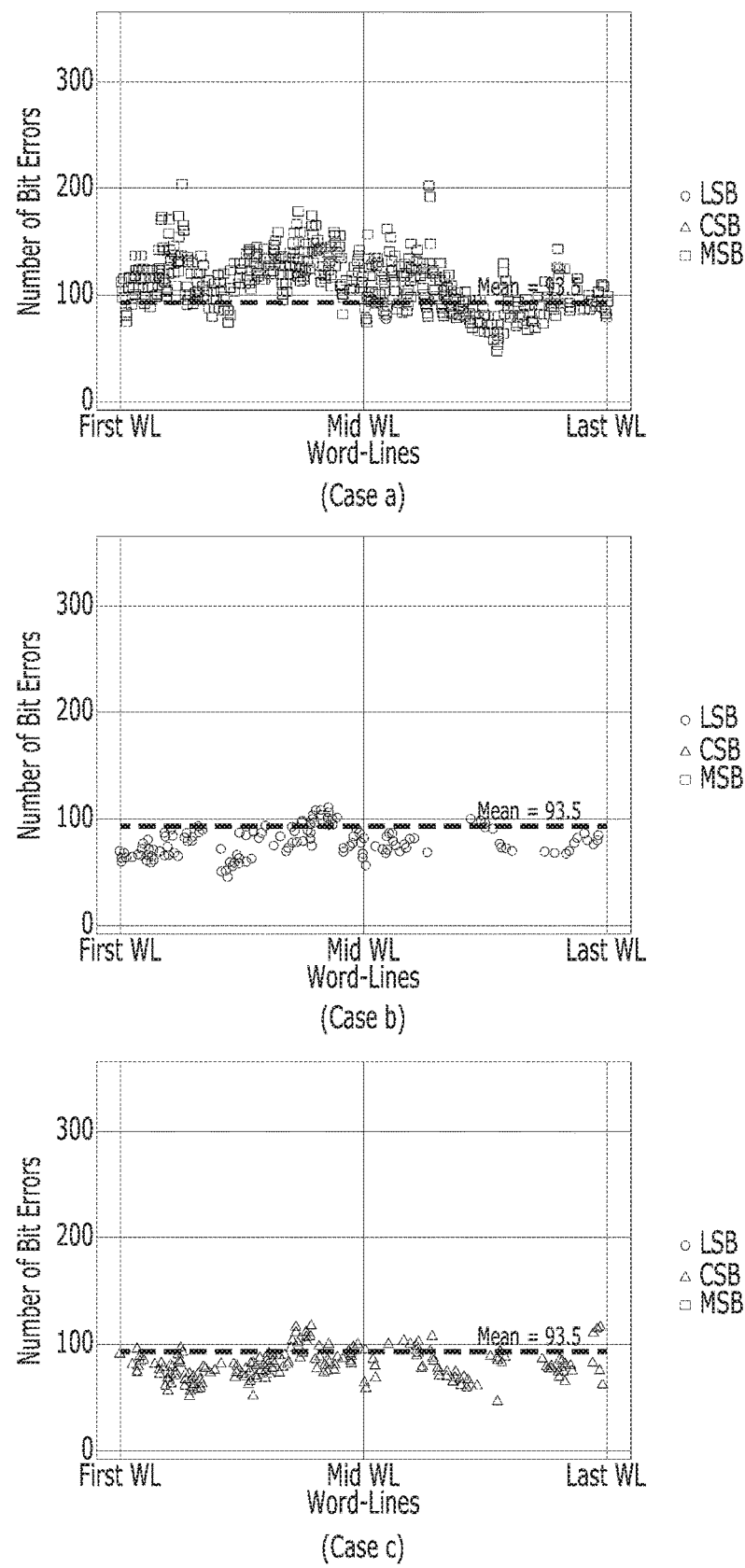
FIGS. 11A and 11B are diagrams respectively illustrating the number of bit errors and decoding failure rates for different word lines when reference voltages according to a word line group are applied for pages.
Figure 11B:
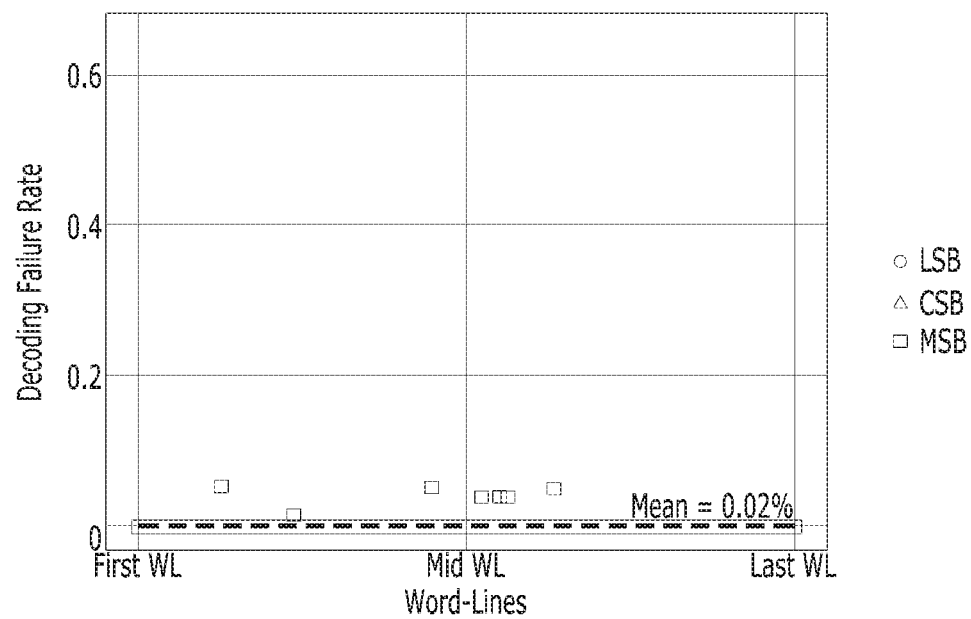

FIGS. 11A and 11B are diagrams illustrating the number of bit errors and decoding failure rates for different word lines, respectively, in accordance with an embodiment of the present invention.

Referring to FIGS. 11A and 11B, it is illustrated that the number of errors and the average decoding failure rates for all word lines when the reference voltage for a page depends on its word line group. In comparison with FIGS. 5A and 5B, both the number of errors and the average decoding failure rate are significantly lowered.

As described above, the controller in accordance with embodiments may apply an optimal reference voltage based on a word line group to which a target page to be read belongs. Embodiments may reduce the number of error bits in data read from the target page, and reduce the decoding failure rate.

Although the foregoing embodiments have been illustrated and described in some detail for purposes of clarity and understanding, the present invention is not limited to the details provided. There are many alternative ways of implementing the invention, as one skilled in the art will appreciate in light of the foregoing disclosure. The disclosed embodiments are thus illustrative, not restrictive. The present invention is intended to embrace all modifications and alternatives that fall within the scope of the claims.

What is claimed is:

1. A memory system comprising:
   a memory device including a plurality of pages coupled to a plurality of word lines; and
   a controller, coupled to the memory device, suitable for:
   receiving a read command from a host;
   determining a target word line group to which a target word line corresponding to the read command belongs, among a plurality of word line groups, which include respective subsets of the plurality of word lines;
   identifying a reference voltage corresponding to the target word line group, among a plurality of reference voltages; and
   controlling the memory device to perform a read operation on a target page coupled to the target word line, among the plurality of pages, using the reference voltage,
   wherein the plurality of word line groups are generated based on at least one of the number of bit errors and decoding failure rates for the plurality of word lines.

2. The memory system of claim 1, wherein the controller translates a logical address corresponding to the read command into a physical address, and determines the target word line group based on the physical address.

3. The memory system of claim 1, wherein the controller includes a memory storing the plurality of reference voltages in association with the plurality of word line groups, a respective reference voltage corresponding to a respective word line group in a one-to-one relationship.

4. The memory system of claim 1, further comprising:
   generating the plurality of word line groups based the number of bit errors and decoding failure rates for a combination of the plurality of word lines and logical pages coupled to the plurality of word lines.

5. The memory system of claim 4, wherein the plurality of word line groups includes a first word line group in which all word lines have a first characteristic, and a second word line group in which all word lines have a second characteristic.

6. The memory system of claim 1, wherein the controller provides the memory device with information on the reference voltage, and
   wherein the memory device includes a voltage generation circuit, which receives the information from the controller, generates the reference voltage and provides the target word line with the reference voltage.

7. A method for operating a memory system comprising:
   receiving a read command from a host;
   determining a target word line group to which a target word line corresponding to the read command belongs, among a plurality of word line groups, which include respective subsets of a plurality of word lines to which a plurality of pages are coupled;
   identifying a reference voltage corresponding to the target word line group, among a plurality of reference voltages; and
   controlling the memory device to perform a read operation on a target page coupled to the target word line, among the plurality of pages, using the reference voltage,
   wherein the plurality of word line groups are generated based on at least one of the number of bit errors and decoding failure rates for the plurality of word lines.

8. The method of claim 7, wherein the determining of the target word line group comprises:
   translating a logical address corresponding to the read command into a physical address; and
   determining the target word line group based on the physical address.

9. The method of claim 7, further comprising:
   storing, in a memory, the plurality of reference voltages in association with the plurality of word line groups, a respective reference voltage corresponding to a respective word line group in a one-to-one relationship.

10. The method of claim 7, further comprising:
    generating the plurality of word line groups based on the number of bit errors and decoding failure rates for a combination of the plurality of word lines and logical pages coupled to the plurality of word lines.

11. The method of claim 10, wherein the plurality of word line groups includes a first word line group in which all word lines have a first characteristic, and a second word line group in which all word lines have a second characteristic.

12. The method of claim 7, wherein the controlling of the memory device to perform the read operation comprises:
providing, by a controller, a memory device with information on the reference voltage;
receiving, by a voltage generation circuit of the memory device, the information from the controller;
generating, by the voltage generation circuit, the reference voltage; and
providing, by voltage generation circuit, the target word line with the reference voltage.

13. A memory system comprising:
a memory device including a plurality of pages coupled to a plurality of word lines; and
a controller coupled to the memory device, suitable for:
generating a plurality of word line groups based on at least one of the number of bit errors and decoding failure rates for the plurality of word lines;
receiving a read command from a host;
determining a target word line group to which a target word line corresponding to the read command belongs, among the plurality of word line groups, which include respective subsets of the plurality of word lines;
identifying a reference voltage corresponding to the target word line group, among a plurality of reference voltages; and
controlling the memory device to perform a read operation on a target page coupled to the target word line, among the plurality of pages, using the reference voltage,
wherein the plurality of word line groups is generated based on at least one of the number of bit errors and decoding failure rates for a combination of the plurality of word lines and logical pages coupled to the plurality of word lines.

14. The memory system of claim 13, wherein the controller translates a logical address corresponding to the read command into a physical address, and determines the target word line group based on the physical address.

15. The memory system of claim 13, wherein the controller includes a memory storing the plurality of reference voltages in association with the plurality of word line groups, a respective reference voltage corresponding to a respective word line group in a one-to-one relationship.

16. The memory system of claim 13, wherein the plurality of word line groups includes a first word line group in which all word lines have a first characteristic, and a second word line group which all word lines have a second characteristic.

17. The memory system of claim 13, wherein the controller provides the memory device with information on the reference voltage, and
wherein the memory device includes a voltage generation circuit, which receives the information from the controller, generates the reference voltage and provides the target word line with the reference voltage.

* * * * *

UNITED STATES PATENT AND TRADEMARK OFFICE
CERTIFICATE OF CORRECTION

| | | |
|---|---|---|
| PATENT NO. | : 11,367,488 B2 | |
| APPLICATION NO. | : 16/711003 | |
| DATED | : June 21, 2022 | |
| INVENTOR(S) | : Bhatia et al. | |

It is certified that error appears in the above-identified patent and that said Letters Patent is hereby corrected as shown below:

On the Title Page

Item (71), Applicant should read:
-- SK hynix Inc., Gyeonggi-do (KR) --

Signed and Sealed this
Ninth Day of August, 2022

Katherine Kelly Vidal
*Director of the United States Patent and Trademark Office*